US011557711B2

(12) United States Patent
Lee et al.

(10) Patent No.: US 11,557,711 B2
(45) Date of Patent: Jan. 17, 2023

(54) MULTI-STACK PIEZO ACTUATOR

(71) Applicant: California Institute of Technology, Pasadena, CA (US)

(72) Inventors: Hyeong Jae Lee, Pasadena, CA (US); Yoseph Bar-Cohen, Pasadena, CA (US); Mircea Badescu, Pasadena, CA (US); Stewart Sherrit, Pasadena, CA (US); Xiaoqi Bao, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 481 days.

(21) Appl. No.: 16/747,354

(22) Filed: Jan. 20, 2020

(65) Prior Publication Data
US 2020/0235279 A1 Jul. 23, 2020

Related U.S. Application Data

(60) Provisional application No. 62/795,717, filed on Jan. 23, 2019.

(51) Int. Cl.
*H01L 41/08* (2006.01)
*B06B 1/06* (2006.01)
(Continued)

(52) U.S. Cl.
CPC .............. *H01L 41/083* (2013.01); *B06B 1/06* (2013.01); *B06B 1/064* (2013.01); *B06B 1/0611* (2013.01);
(Continued)

(58) Field of Classification Search
CPC ......... B06B 1/06; B06B 1/0611; B06B 1/064; H01L 41/0835
(Continued)

(56) References Cited

U.S. PATENT DOCUMENTS 4,373,143 A * 2/1983 Lindberg .............. B06B 1/0618
310/334
4,721,107 A 1/1988 Bolg et al.
(Continued)

FOREIGN PATENT DOCUMENTS

JP S63256831 A 10/1988
JP 2007117934 A 5/2007
(Continued)

OTHER PUBLICATIONS

International Search Report for International Application No. PCT/US2020/014276 filed on Jan. 20, 2020 on behalf of California Institute of Technology dated Jun. 5, 2020 3 pages.
(Continued)

*Primary Examiner* — Derek J Rosenau
(74) *Attorney, Agent, or Firm* — Steinfl + Bruno, LLP

(57) ABSTRACT

An ultrasonic actuator with increased radiating surface is presented. The increased radiating surface is provided by a plurality of piezoelectric stacks that are each compressed by action of a respective bolt against a common backing structure of the actuator. According to one aspect, each of the stacks includes a plurality of stacked piezoelectric rings with the respective bolt arranged through the central opening of the rings. According to another aspect, one or both of the backing structure and the horn of the actuator include tuning grooves and/or tuning slots to produce amplitude uniformity of displacement through the actuator. According to another aspect, the radiating surface has a symmetrical shape about an axial direction of the actuator with a lateral dimension that is in a range between one quarter and one half of the wavelength of operation of the actuator.

21 Claims, 9 Drawing Sheets

(51) Int. Cl.
*H01L 41/083* (2006.01)
*H01L 41/09* (2006.01)
*H02N 2/00* (2006.01)

(52) U.S. Cl.
CPC .......... *H01L 41/0835* (2013.01); *H01L 41/09* (2013.01); *H02N 2/001* (2013.01)

(58) Field of Classification Search
USPC .................................................. 310/322, 334
See application file for complete search history.

(56) References Cited

U.S. PATENT DOCUMENTS

| | | | |
|---|---|---|---|
| 6,204,592 B1 * | 3/2001 | Hur .......................... | A61C 1/07 310/323.12 |
| 6,605,178 B1 * | 8/2003 | Shinohara ........... | B29C 66/8145 156/580.2 |
| 8,910,727 B2 | 12/2014 | Bar-Cohen et al. | |

FOREIGN PATENT DOCUMENTS

| KR | 101434142 B1 | 9/2014 |
|---|---|---|
| KR | 20170057658 A | 5/2017 |

OTHER PUBLICATIONS

Written Opinion for International Application No. PCT/US2020/014276 filed on Jan. 20, 2020 on behalf of California Institute of Technology dated Jun. 5, 2020 7 pages.

* cited by examiner

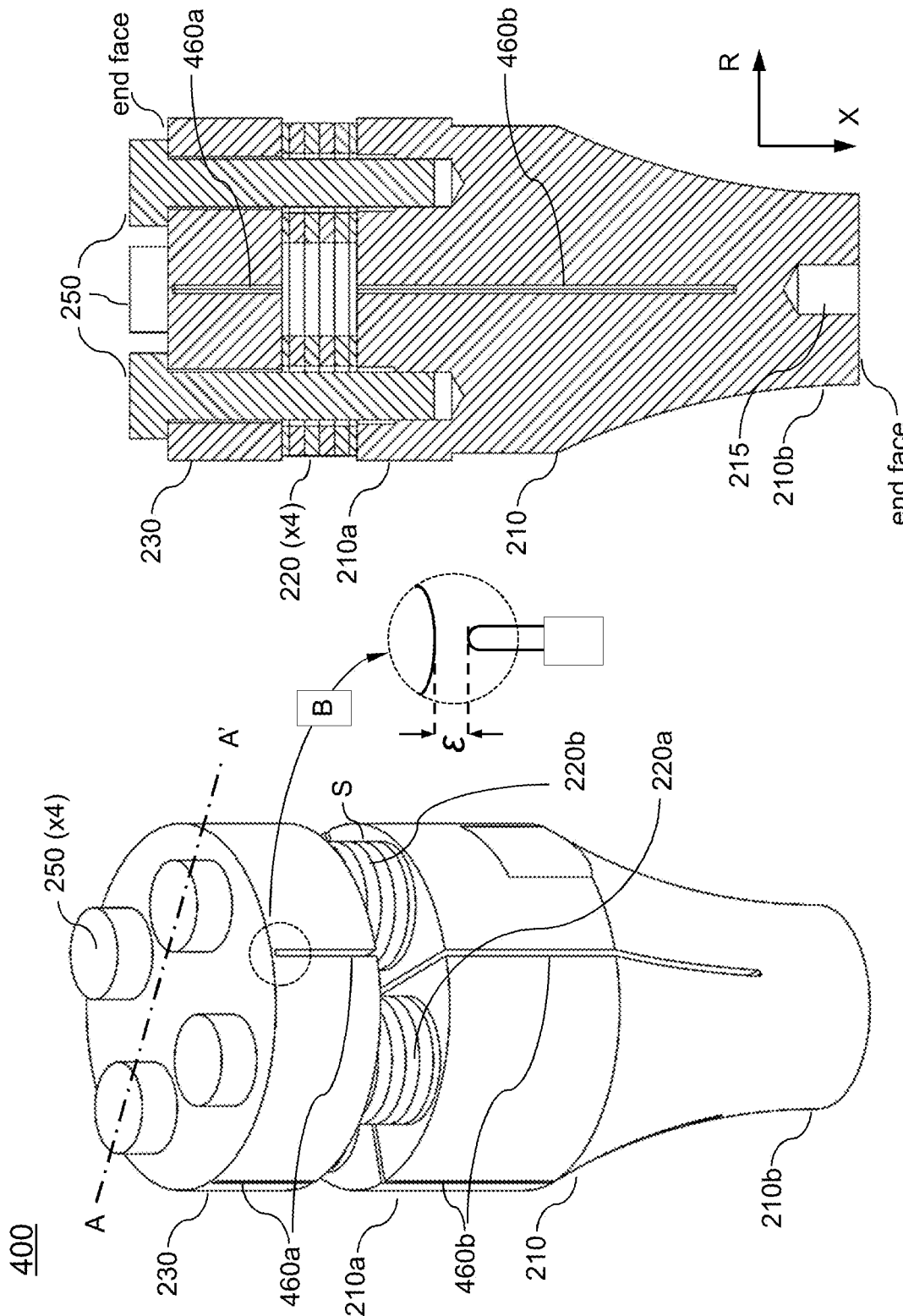

MULTI-STACK PIEZO ACTUATOR

CROSS REFERENCE TO RELATED APPLICATIONS

The present application claims priority to and the benefit of U.S. provisional patent application Ser. No. 62/795,717 entitled "The PARoD Transducer With Multi-Stack Piezo Actuators (MuSPA)", filed on Jan. 23, 2019, the disclosure of which is incorporated herein by reference in its entirety.

The present application may be related to U.S. Pat. No. 8,910,727 B2 entitled "Ultrasonic/Sonic Jackhammer" issued on Dec. 16, 2014, the disclosure of which is incorporated herein by reference in its entirety.

STATEMENT AS TO FEDERALLY SPONSERED RESEARCH

This invention was made with government support under Grant No. 80NM0018D004 awarded by NASA (JPL). The government has certain rights in the invention.

TECHNICAL FIELD

The present disclosure relates to systems and methods for generating ultrasonic and/or sonic percussive action on a surface. Applications may include drilling, coring, fracturing and penetrating of very hard materials.

BACKGROUND

FIG. 1A shows a prior art ultrasonic piezoelectric actuator (100a) that can generate amplified ultrasonic (e.g., in a range of 20 kHz to 40 kHz) stress (e.g., displacement, vibration) at a tip (110b) of a horn (110) based on ultrasonic stress generated by a combination of piezoelectric elements (120) compressed by action of a bolt (150) between a horn 110a and a backing structure (130). The ultrasonic stress is (rigidly) coupled/connected to a (radiating) surface S at a base (110a) of the horn (110) and amplified by the geometry of the horn (110) to provide the amplified ultrasonic stress at the tip (110b) of the horn (110) in an axial direction X of the actuator (100a).

FIG. 1B shows a prior art ultrasonic piezoelectric actuator (100b) wherein higher vibrating power is provided by a) extending a lateral dimension of the surface S of the actuator (100b) through contact of three laterally aligned piezoelectric elements (120) compressed by action of two lateral bolts (150), arranged on either sides of the elements (120), against the backing structure (130), and b) using a plurality of such actuators (100b), arranged in an angled configuration, to provide an increased (combined) radiated power as described in the above referenced U.S. Pat. No. 8,910,727 B2. It should be noted that because the actuator (100b) does not include a symmetrical surface around the axial direction, X, usage of such actuator for rotary drill action may not be adequate.

A total vibration power, P, radiated at the surface S of the actuator (100a, 100b)) is proportional to a load impedance (Z), frequency (w) and amplitude (A) of the vibration, and the area of the surface S as given by: $P \sim Z\omega^2 A^2 S$. Therefore, for a constant load and frequency, an increased total radiated vibration power can be achieved by increasing either the amplitude A of the vibration or the area of the surface S. The amplitude A of the vibration cannot be increased above a certain level due to electrical and mechanical limits of piezoelectric materials of the piezoelectric elements (120). Furthermore, a maximum lateral dimension (i.e., in a radial plane) of the area of the surface S may be increased up to a certain level below a quarter wavelength ($\lambda/4$) of operation of the actuator, above which level radial displacement in the radial direction R of the actuator (100a, 100b) becomes more dominant than the axial displacement in the axial direction X (wherein $\lambda$ is defined by the driving frequency of the piezoelectric elements and the speed of sound in the actuator (100a, 100b) material; for example, for a driving frequency of 20 kHz and an average speed of sound in the actuator material of 4500 m/s, the wavelength $\lambda$ is about 0.225 m).

Excessive radial displacement may in turn result in a disruption of axial displacement and lead to poor amplitude uniformity at the two end faces (outer surfaces) of the actuator (100a, 100b), including the face of the horn tip (110b) and the face of the backing structure (130) that is away from the piezoelectric elements (120). Such poor amplitude uniformity may produce higher amplitude vibration at respective center regions of the two end faces and lower amplitude vibration at respective outer perimeter regions of the two end faces. In particular, as related to the poor amplitude uniformity at the end face of the backing structure (130), considerable parasitic bending modes of the prestressed bolt (150) which can lead to prestress loss and bolt failure can be obtained.

Teachings according to the present disclosure aim at providing systems and methods to produce ultrasonic actuators with higher total vibration power while circumventing the above problems and not necessarily requiring a plurality of such actuators. Such transducers may be used in, for example, percussive, or rotating and percussive, drills with increased percussive power.

SUMMARY

According to an embodiment of the present disclosure, a multi-stack piezoelectric actuator is presented wherein a higher vibration power is provided via an increase of the radiating surface provided by sum of surfaces of a plurality of piezoelectric stacks, wherein each of the piezoelectric stacks is compressed by action of a respective bolt against a common backing structure of the actuator.

According to an embodiment of the present disclosure, each of the piezoelectric stacks comprises a plurality of stacked piezoelectric elements, each element shaped as a ring, with the respective bolt arranged through a central opening of the ring. According to an alternative embodiment of the present disclosure, each element of the stack can include segmented piezoelectric sub-elements arranged around the respective bolt. Accordingly, each of the stacks of the present disclosure includes/forms a central opening through which the respective bolt is arranged/guided.

According to an embodiment of the present disclosure, the radiating surface of the present actuator has a lateral dimension that is substantially larger than the quarter wavelength ($\lambda/4$) of operation of the actuator. According to an exemplary embodiment of the present disclosure, the lateral dimension is about, or equal to, half of the wavelength of operation ($\lambda/2$) of the actuator.

According to an embodiment of the present disclosure, one or both of the backing structure and the horn of the present actuator comprise a (circumferential) tuning groove that enhances/increases amplitude uniformity of displacements through the backing structure and the horn. Accordingly, prestress loss and bolt failure are reduced.

According to an embodiment of the present disclosure, one or both of the backing structure and the horn of the present actuator comprise a plurality of tuning slots that enhance/increase amplitude uniformity of displacements through the backing structure and the horn. Accordingly, prestress loss and bolt failure are reduced.

According to an embodiment of the present disclosure, the plurality of tuning slots isolate/separate/distance surface areas of the backing structure and/or the horn that are in contact with different piezoelectric stacks.

According to an embodiment of the present disclosure, the plurality of tuning slots pass through the surface of the backing structure and/or the horn that is in contact with the piezoelectric stacks, and extend axially toward respective opposite surfaces to stop before such opposite surfaces.

According to an exemplary embodiment of the present disclosure, the plurality of tuning slots extend radially from a central region of the backing structure and/or horn to respective perimeter/edge of the backing structure and/or horn.

According to an embodiment of the present disclosure, the tuning groove and slots can coexist to further enhance/increase the amplitude uniformity.

According to a non-limiting exemplary embodiment of the present disclosure, the multi-stack piezoelectric actuator comprises a symmetrical shape around the axial direction. According to an embodiment of the present disclosure, such symmetrical shape may be with respect to the backing structure and the horn of the actuator, including respective end faces. According to a non-limiting exemplary embodiment of the present disclosure, the symmetrical shape may be round. Other shapes, such as square, pentagon, hexagon, octagon, decagon, or other multi-side symmetrical shapes may also be envisioned.

According to an exemplary embodiment of the present disclosure, the actuator is rigidly coupled to a drill bit to provide a percussive drill action with increased percussive power. Furthermore, the actuator may be rigidly coupled to a rotary actuator to provide a rotary percussive drill action with increased percussive power. According to an exemplary embodiment of the present disclosure, the rigid coupling of the drill bit may be provided via a bore at a tip of the horn, and the rigid coupling of the rotary actuator may be provided via a shaft that is rigidly coupled to a nodal plane of the horn (e.g., plane where no axial displacement of the horn exists) through a bore inside the horn.

According to one embodiment the present disclosure, an ultrasonic actuator is presented, the ultrasonic actuator comprising: a backing structure; a plurality of piezoelectric stacks configured to generate ultrasonic frequency vibrations; a horn configured to amplify the ultrasonic frequency vibrations along an axial direction of the horn; and a plurality of bolts, each bolt of the plurality of bolts configured to compress a respective piezoelectric stack of the plurality of piezoelectric stacks between the horn and the backing structure.

According to a second embodiment of the present disclosure, a method for increasing radiating power of an ultrasonic actuator is presented, the method comprising: providing a plurality of piezoelectric stacks; compressing each of the plurality of piezoelectric stacks through action of a respective bolt between a horn and a backing structure; based on the providing and the compressing, increasing a radiating surface at a base of the horn that is rigidly coupled to the plurality of piezoelectric stacks; and based on the increasing of the radiating surface, increasing the radiating power.

Further aspects of the disclosure are shown in the specification, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure. Same reference designators refer to same features.

FIG. 4A and FIG. 4B respectively show a perspective view and a cross sectional view according to an embodiment of the present disclosure of an ultrasonic multi-stack piezoelectric actuator with higher total vibration power and tuning slots.

DETAILED DESCRIPTION

Figure 1B:
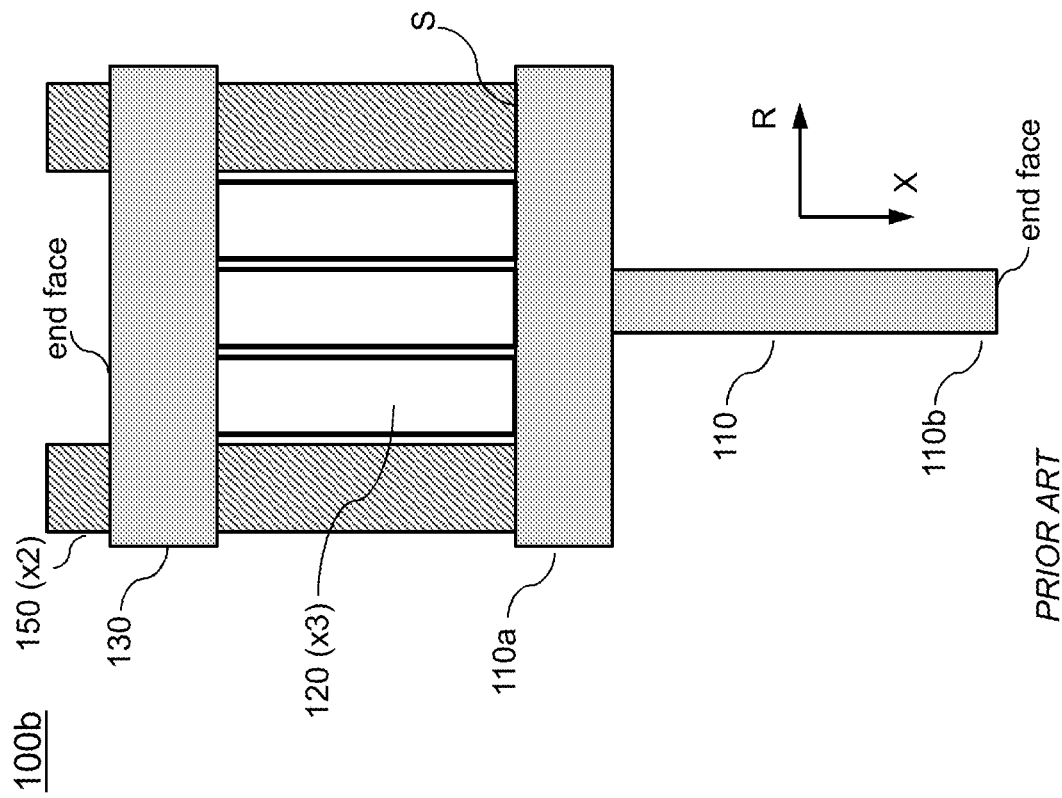
FIG. 1B shows a prior art ultrasonic actuator with higher total vibration power.
Figure 1A:
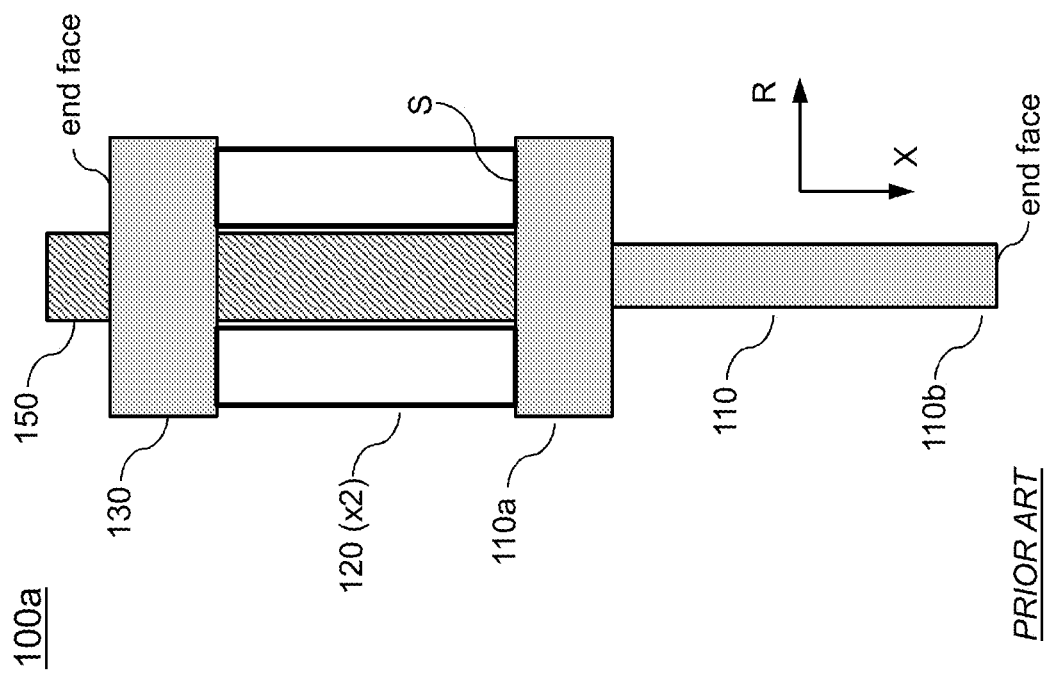
FIG. 1A shows a prior art ultrasonic actuator.
Figures 2A, 2B:
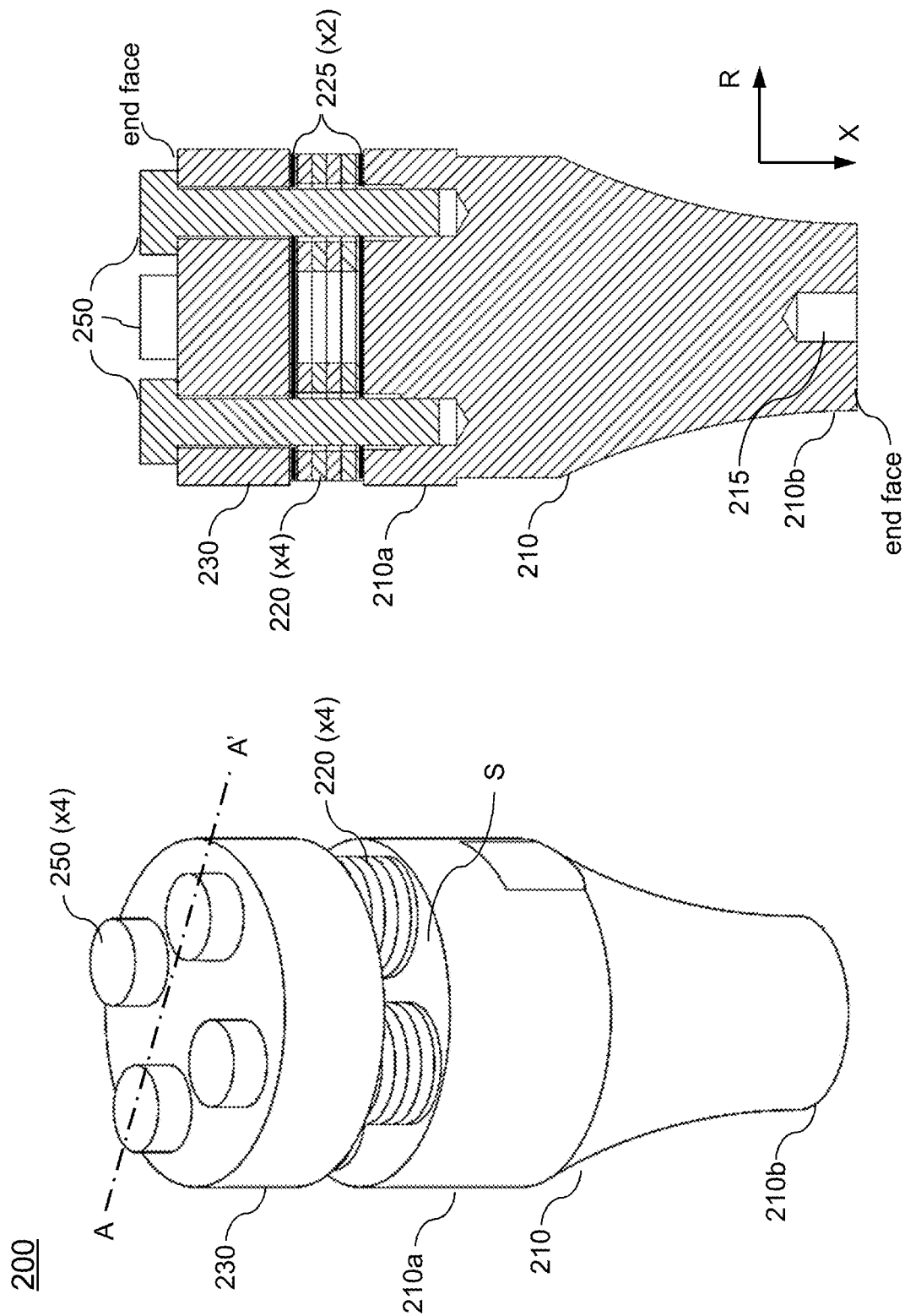
FIG. 2A and FIG. 2B respectively show a perspective view and a cross sectional view according to an embodiment of the present disclosure of an ultrasonic multi-stack piezoelectric actuator with higher total vibration power.

FIG. 2A and FIG. 2B respectively show a perspective view and a cross sectional view according to an embodiment of the present disclosure of a multi-stack piezoelectric actuator (200) with higher total vibration power. As can be seen in FIG. 2A, an increase of the radiating surface S is provided by rigidly coupling said surface to a plurality (e.g., four) of stacks of piezoelectric elements (220, piezoelectric stacks) compressed by action of a plurality (e.g., four) bolts (250) between a horn (210) and a backing structure (230). Accordingly, due to the increase of the radiating surface S, a higher radiating power can be obtained at the radiating surface 5, and therefore at the end face of horn (210) formed at the tip (210b).

With further reference to FIG. 2A and FIG. 2B, each of the plurality of piezoelectric stacks (220) is predominantly compressed by action of a respective bolt (250) of the plurality of bolts (250). Applicant of the present disclosure has found that such arrangement can allow for a larger radiating surface S while maintaining an acceptable level of radial displacement such as to not affect the integrity of the prestress bolts (250). In particular, maximum lateral dimension of the radiating surface can be as large as half of the wavelength of operation ($\lambda/2$) of the actuator (200). In a case of a symmetrical radiating surface S (i.e., around the axial axis X) as shown in FIG. 2A and FIG. 2B, such maximum lateral dimension can be the same in all angular directions, or in directions corresponding to several quadrants (e.g., four or more), of the radiating surface S.

According to an exemplary embodiment of the present disclosure, as shown in FIG. 2A, the shape of the radiating surface S is round. According to an exemplary embodiment of the present disclosure, such round shape may have a diameter of 4.5 inches (e.g., about 11.5 centimeters), or in any range between 4 to 5 inches (e.g., in a range between 10.0 to 13.0 centimeters) for operation of the actuator (200) at ultrasonic frequencies of 20 kHz to 40 kHz. A person skilled in the art will appreciate such large radiating surface which is substantially larger than that of known in the art ultrasonic actuators (e.g., a quarter of the wavelength of operation $\lambda/4$).

According to an embodiment of the present disclosure, each piezoelectric element of the piezoelectric stacks (220) is shaped as a ring with the respective bolt (250) arranged through a central opening of the ring as shown in FIG. 2B. According to an alternative embodiment of the present disclosure, each piezoelectric element of the piezoelectric stacks (220) can include segmented piezoelectric sub-elements arranged around the respective bolt. Such segmented sub-elements may be arranged adjacent to one another in order to form a substantially closed space of piezoelectric elements around the respective bolt (250). According to an exemplary embodiment of the present disclosure, each of the piezoelectric stacks (220) includes a same number of stacked layers of piezoelectric elements, such as, for example, four (as shown on the figure) or more.

Because the piezoelectric elements are electrically coupled to an electric source of excitation (not shown in the figures), insulating layers (225) may be used to insulate the electric source from the horn (210) and/or the backing structure (230). Such insulating layers (225) may be single contiguous layers in contact with the radiating surface S and the surface of the backing structure (230) facing the radiating surface S. Alternatively, such insulating layers (225) may be separate layers to individually isolate the surfaces of the piezoelectric stacks (220) from the horn (210) and/or the backing structure (230).

Figure 7:
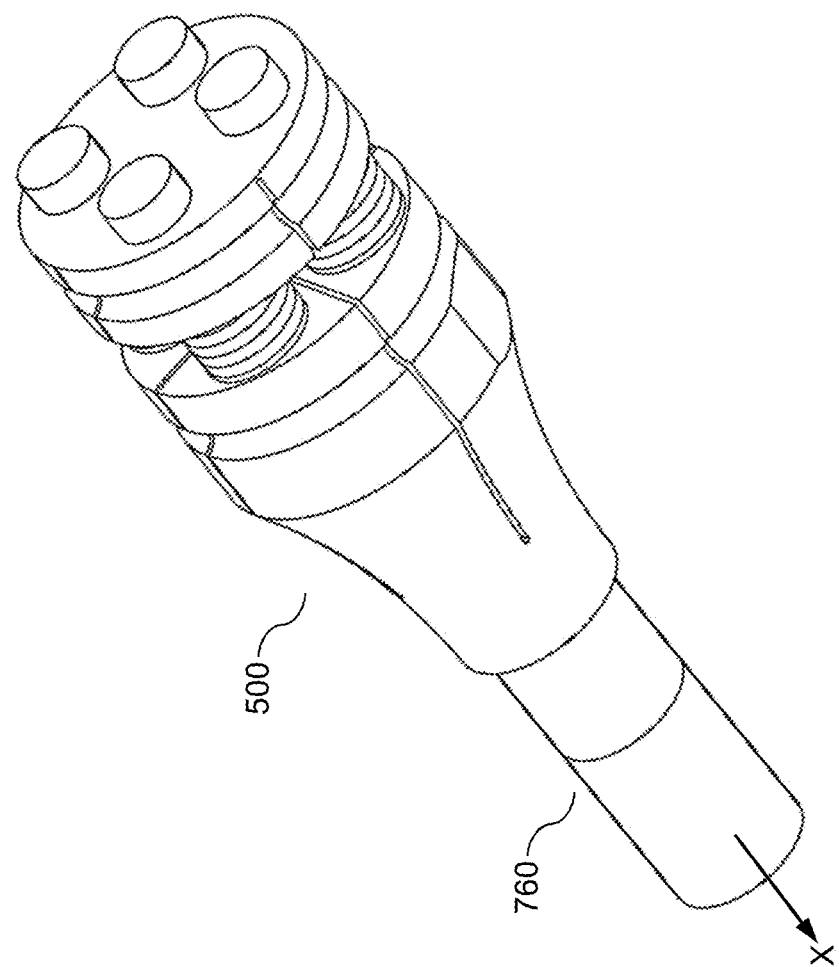
FIG. 7 shows a perspective view of a percussive drill according to an embodiment of the present disclosure comprising the ultrasonic actuator of FIG. 5B coupled to a drill bit for increased percussive power.

With continued reference to FIG. 2B, the ultrasonic actuator (200) may comprise a bore (215) that forms a hollow core along the axial direction, X, of the actuator (200) to allow for insertion and rigid coupling of, for example, a drill bit, as shown in FIG. 7 later described. As shown in FIG. 2B, the bore (215) may be formed through the end face at the tip (210b) of the horn (210).

Figures 3A, 3B:
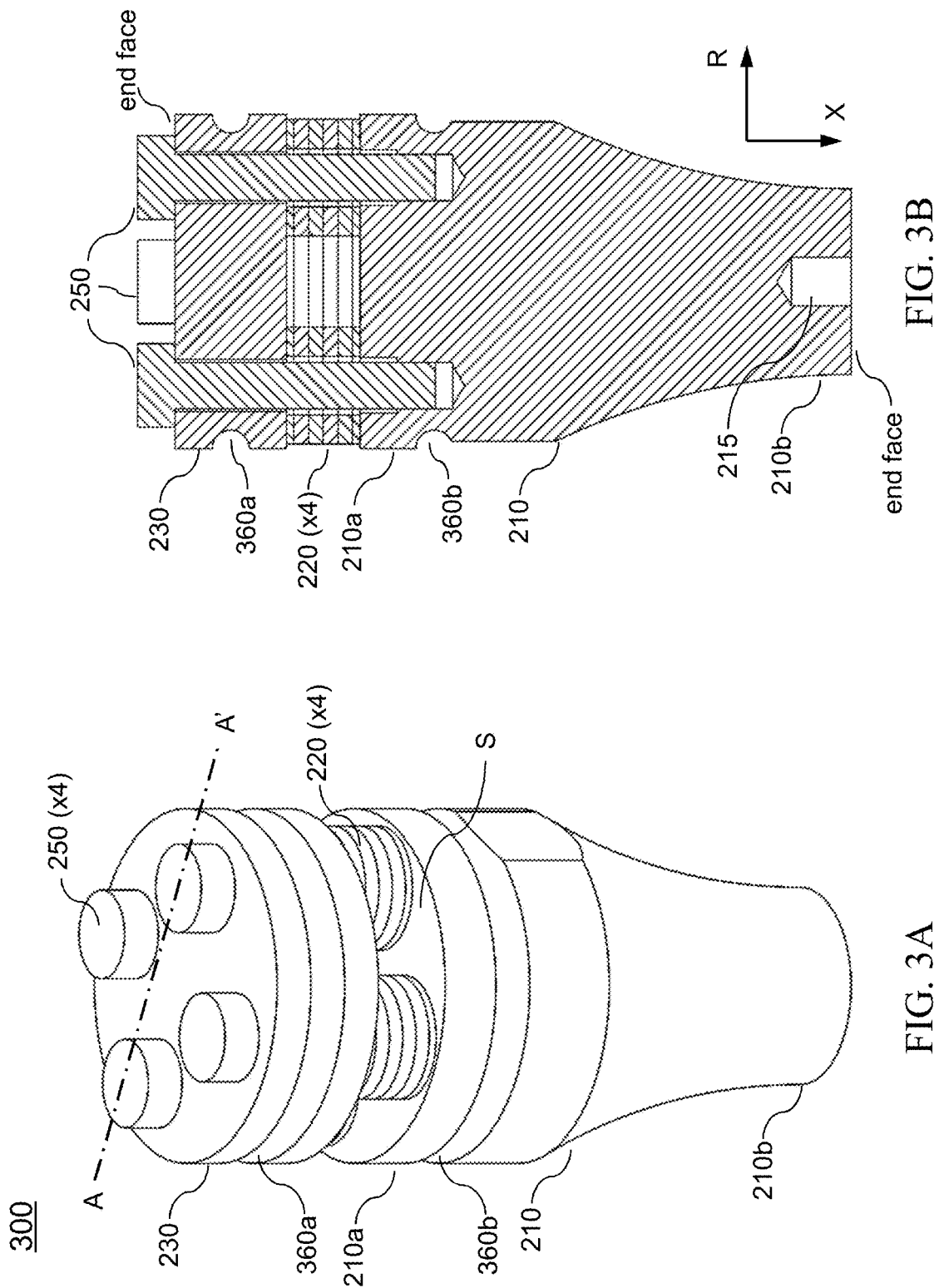
FIG. 3A and FIG. 3B respectively show a perspective view and a cross sectional view according to an embodiment of the present disclosure of an ultrasonic multi-stack piezoelectric actuator with higher total vibration power and tuning grooves.

FIG. 3A and FIG. 3B respectively show a perspective view and a cross sectional view according to an embodiment of the present disclosure of an ultrasonic multi-stack piezoelectric actuator (300) with higher total vibration power and tuning grooves (360a, 360b). A person skilled in the art will clearly realize that the actuator (300) is based on the actuator (200) described above with reference to FIG. 2A and FIG. 2B with the addition of the tuning grooves (360a, 360b). Applicant of the present disclosure have found that the tuning grooves (360a, 360b) can help further enhance/increase amplitude uniformity of displacements at the end face of the backing structure (230) and thereby reduce parasitic bending modes of the prestress bolts (250). It should be noted that although FIG. 3A and FIG. 3B show respective tuning grooves (360a) and (360b) formed in the backing structure (230) and the horn (210), embodiments according to the present disclosure may include one such tuning groove (360a or 360b) in either the backing structure (230) or the horn (210), or in both (as shown in the figures).

With continued reference to FIG. 3A and FIG. 3B, the tuning groove (360a) is formed laterally around a perimeter surface of the backing structure (230). According to an exemplary embodiment of the present disclosure, the tuning groove (360a) may have the form of a semi-circle cut into the lateral surface of the backing structure (230) as shown in FIG. 3B. In other words, a cross section of the tuning groove (360a) in a plane that includes the axial direction X (e.g., per FIG. 3B) may have the form of a semi-circle. Other shapes of the tuning groove (360a) may also be envisioned and therefore the shown semi-circle may not be construed as limiting the scope of the present teachings. According to an exemplary embodiment of the present disclosure, a maximum height (e.g., width) of the tuning groove (360a) in the axial direction may be about one third a total height of the backing structure (230). According to an exemplary embodiment of the present disclosure, the tuning groove (360a) may be centrally arranged (in the axial direction, X) about the backing structure (230).

Figure 6:
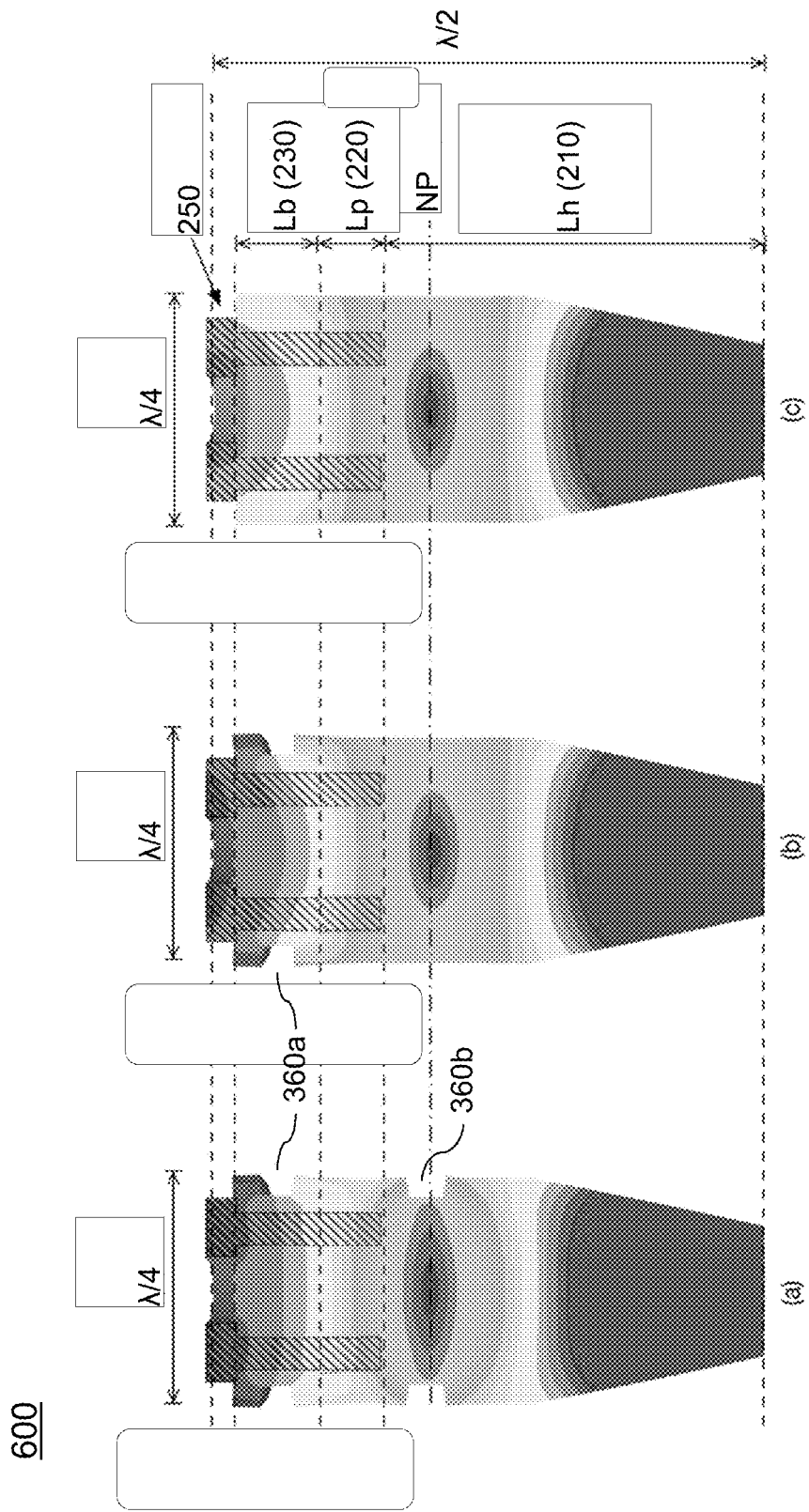
FIG. 6 shows displacement amplitude contours of the ultrasonic multi-stack piezoelectric actuator according to the present disclosure for three different configurations.

With continued reference to FIG. 3A and FIG. 3B, the tuning groove (360b) is formed laterally around a perimeter surface of the horn (210) in a region of the base (210a) of said horn. In other words, the tuning grove (360b) is formed in a region of the horn (210) that has a cross section surface (i.e., in a radial plane) with similar area to the radiating surface S. According to an exemplary embodiment of the present disclosure, the tuning groove (360b) may have the form of a semi-circle cut into the lateral surface of the base (210a) of the horn (210) as shown in FIG. 3B. Other shapes of the tuning groove (360b) may also be envisioned. According to an exemplary embodiment of the present disclosure, a maximum height of the tuning groove (360b) in the axial direction may be similar to a height of the tuning groove (360a) described above. According an exemplary embodiment of the present disclosure, the tuning groove (360b) may be arranged in a region of the base (210a) at an axial position that overlaps with a position of the bolts (250). In other words, a radial plane of the tuning groove (360b) contains segments of the bolts (250) as shown in FIG. 3B. According to an exemplary embodiment of the present disclosure, such axial position may contain a nodal plane, NP, of the horn (210) (e.g., as shown in FIG. 6).

FIG. 4A and FIG. 4B respectively show a perspective view and a cross sectional view according to an embodiment of the present disclosure of an ultrasonic multi-stack piezoelectric actuator (400) with higher total vibration power and tuning slots (460a, 460b). A person skilled in the art will clearly realize that the actuator (400) is based on the actuator (200) described above with reference to FIG. 2A and FIG. 2B with the addition of the tuning slots (460a, 460b). Applicant of the present disclosure have found that the tuning slots (460a, 460b) can help further enhance/increase amplitude uniformity of displacements at the end face of the backing structure (230) and thereby reduce parasitic bending modes of the prestress bolts (250). It should be noted that although FIG. 4A and FIG. 4B show respective tuning slots (460a) and (460b) formed in the backing structure (230) and the horn (210), embodiments according to the present disclosure may include tuning slots (460a) only, tuning slots (460b) only, or both (as shown in the figures).

With continued reference to FIG. 4A and FIG. 4B, the tuning slots (460a) isolate/separate/distance surface areas of the backing structure (230) that are in contact with different piezoelectric stacks (220), and tuning slots (460b) isolate/separate/distance surface areas of the radiating surface, S, that are in contact with different piezoelectric stacks (220). For example, as shown in FIG. 4A, two tuning slots (460b), isolate/separate/distance a surface area of the radiating surface, S, that is in contact with a piezoelectric stack (220a) from a surface area of the radiating surface, S, that is in contact with a piezoelectric stack (220b). Similarly, two tuning slots (460a), isolate/separate/distance a surface area of the backing structure (230) that is in contact with the piezoelectric stack (220a) from a surface area of the backing structure (230) that is in contact with the piezoelectric stack (220b).

With further reference to FIG. 4A and FIG. 4B, each of the tuning slots (460a) passes through the surface of the backing structure (230) that is in contact with the piezoelectric stacks (220), extends axially towards the opposite surface of the backing structure (230) (i.e., surface that forms the end face of the backing structure), and stops before such opposite surface. As shown in the detail B of FIG. 4A, an axial gap/distance having a length E is thereby formed between an edge of each tuning slot (460a) and the opposite surface of the backing structure (230) (i.e., a top edge of the backing structure).

Similarly, as shown in FIG. 4A and FIG. 4B, each of the tuning slots (460b) passes through the radiating surface, S, of the horn (210), which is in contact with the piezoelectric stacks (220), extends axially towards the opposite surface of the horn (210) (i.e., surface that forms the end face of the horn), and stops before such opposite surface. As shown in the figures, each of the tuning slots (460b) extends axially, starting from the radiating surface S and through the entire length of the base (210a) of the horn (210) and stops in a region of the horn (210) that is near or at the tip (210b).

Figure 4C:
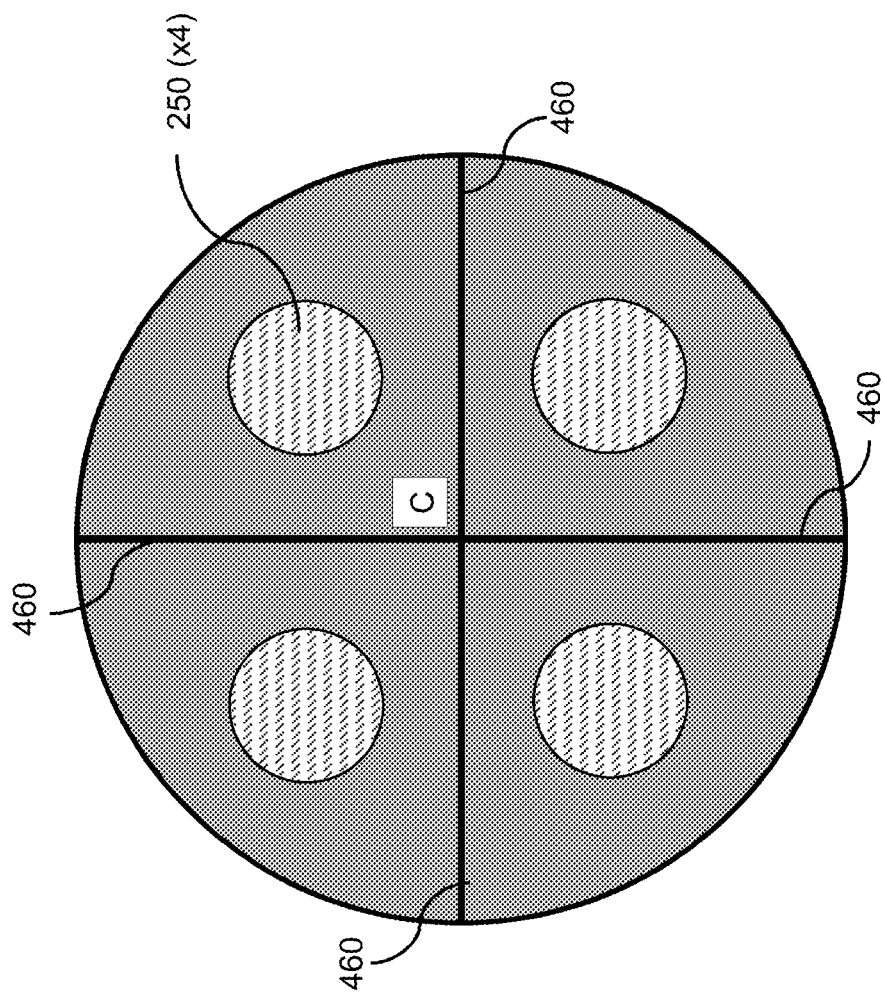
FIG. 4C shows an exemplary representation of tuning slots in a radial plane of the actuator shown in FIG. 4A and FIG. 4B.

According to an embodiment of the present disclosure, the tuning slots (460a, 460b shown in FIG. 4A and FIG. 4B, extend radially from a central region of the backing structure (230) and/or the horn (210), to a respective perimeter/edge of the backing structure (230) and/or the horn (210). An exemplary representation of the tuning slots in a radial plane of the actuator (400) (i.e., a plane orthogonal to the axial direction X) is shown in FIG. 4C, for a case of four tuning slots (labelled as 460) that radially extend from a center of symmetry, C, of the actuator (400). A person skilled in the art would clearly know how to extend the teachings according to the present disclosure for cases where a number of the tuning slots is different from four (e.g., shown in FIG. 4C).

Figure 5B:
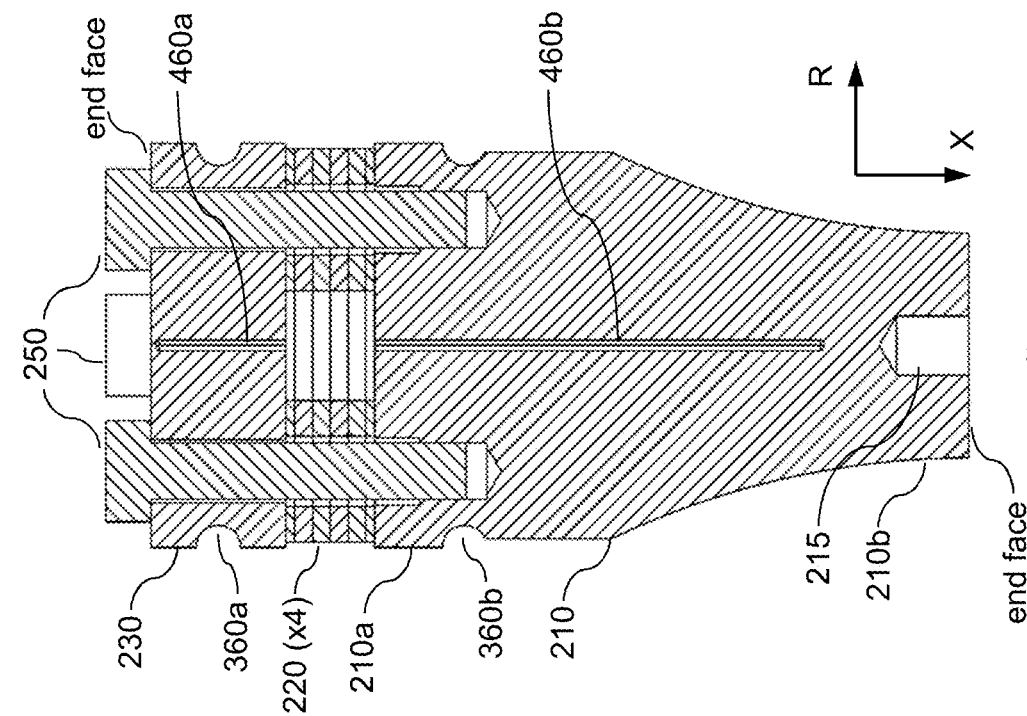
FIG. 5A and FIG. 5B respectively show a perspective view and a cross sectional view according to an embodiment of the present disclosure of an ultrasonic multi-stack piezoelectric actuator with higher total vibration power, tuning grooves and tuning slots.
Figure 5A:
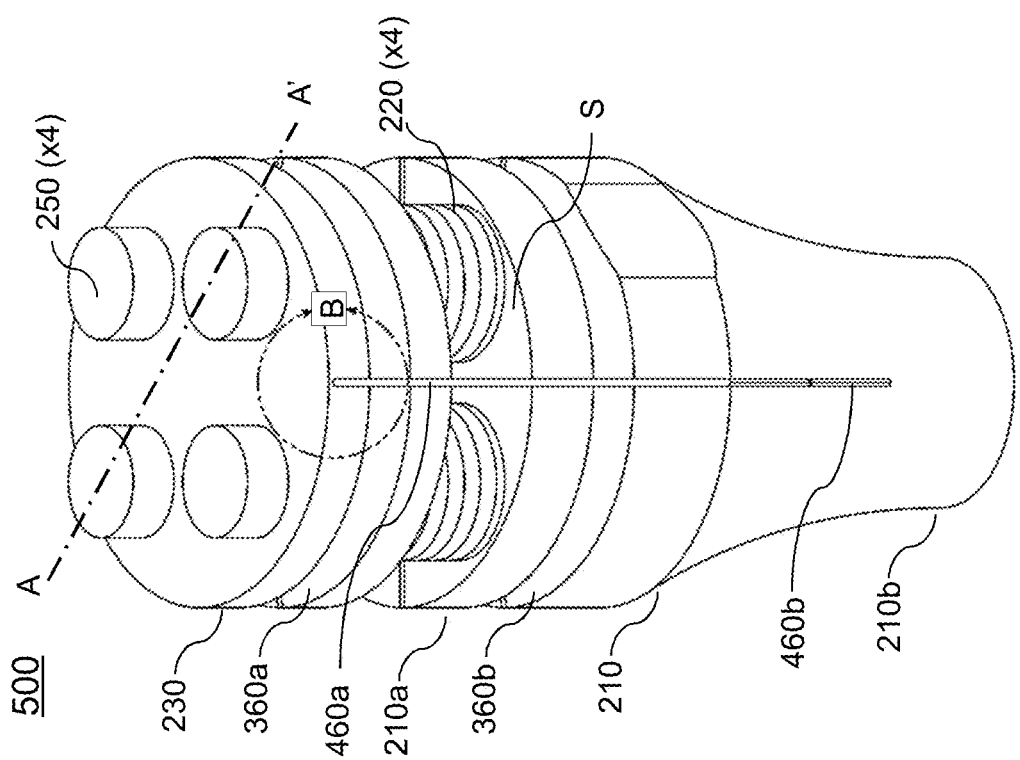

FIG. 5A and FIG. 5B respectively show a perspective view and a cross sectional view according to an embodiment of the present disclosure of an ultrasonic multi-stack piezoelectric actuator (500) with higher total vibration power, tuning grooves (360a, 360b) and tuning slots (460a, 460b). A person skilled in the art will clearly realize that the actuator (500) is based on the actuators (200, 300, 400) described above for case where the tuning grooves (360a, 360b) and the tuning slots (460a, 460b) coexist. Applicant of the present disclosure have found that such tuning elements can help in tuning displacement characteristics of the actuator (500) having a lateral dimension that is about, or equal to, half of the wavelength of operation ($\lambda/2$) of the actuator, thereby providing for a larger radiating surface S, while maintaining an acceptable level of radial displacement through the actuator such as to not affecting integrity of the prestress bolts (250).

FIG. 6 shows displacement amplitude contours of the ultrasonic multi-stack piezoelectric actuator according to the present disclosure for three different configurations, including a configuration (a) based on the actuator (300) described above with reference to FIG. 3A and FIG. 3B having the tuning grooves (360a) and (360b), a configuration (b) based on the actuator (300) described above with reference to FIG. 3A and FIG. 3B having the tuning groove (360a), and a configuration (c) based on the actuator (200) described above with reference to FIG. 2A and FIG. 2B, wherein all configurations use a same base configuration, (e.g., actuator 200 with same elements/design/dimensions). In particular as shown in FIG. 6, a maximum lateral/radial width of the base actuator used on FIG. 6 is $\lambda/4$, and a length (e.g., end face to end face) of such base actuator is $\lambda/2$. Finally, as clearly understood by a person skilled in the art, the displacement contours are shown in various shades of grey, wherein for a given contour shape provided by a given shade of grey, displacement amplitudes within the contour shape are substantially constant.

As can be seen in FIG. 6, in a region of the backing structure (230) and the piezoelectric stacks (220) bolts (250), with axial lengths indicated by respective labels Lb and Lp in FIG. 6, the shapes of the various contours are flattest for the configuration (a), less flat for the configuration (b), and least flat for the configuration (c). This clearly indicates that addition of the tuning groove (360a) to configuration (b) from configuration (a), and tuning groove (360b) to configuration (c) from configuration (b), gradually provides for more uniform displacement amplitudes across the backing structure (230) and the piezoelectric stacks (220), and therefore gradually reduces bending mode vibration of the bolts (250). This is particularly important for large diameter ($\lambda/4$ and larger) actuator designs where piezoelectric stacks (220) with stress bolts (250) are located at the peripheral regions of the actuators. It should be noted that amplitude uniformity of the displacement at the end faces (see previous figures) may depend on depth, width and location of the grooves (360a, 360b), wherein corresponding optimum design parameters may be found by using finite element analytical models. For the exemplary design shown in FIG. 6, for higher amplitude uniformity of the displacement at the end faces, the optimum locations of the grooves (360a, 360b) were found to be in the middle of the thickness of the backing structure (230) and at the nodal plane of the actuator as shown in the figure, while the grooves length and width were found to be one third of the length of backing structure (Lb/3).

FIG. 7 shows a perspective view of a percussive drill (700) according to an embodiment of the present disclosure comprising the ultrasonic actuator (500) of FIG. 5B coupled to a drill bit (760) for increased percussive power. Although not shown in FIG. 7, the drill bit (760) may be rigidly coupled to the actuator (500) through insertion of the drill bit (760) into the bore (215) described above with reference to FIG. 2B. Such rigid coupling between the actuator (500) and the drill bit (760) allows for efficient transfer of power between the end face at the tip (e.g., 210b, FIG. 5B) of the horn (e.g., 210, FIG. 5B) of the actuator (500) and the drill bit (760).

Figure 8:
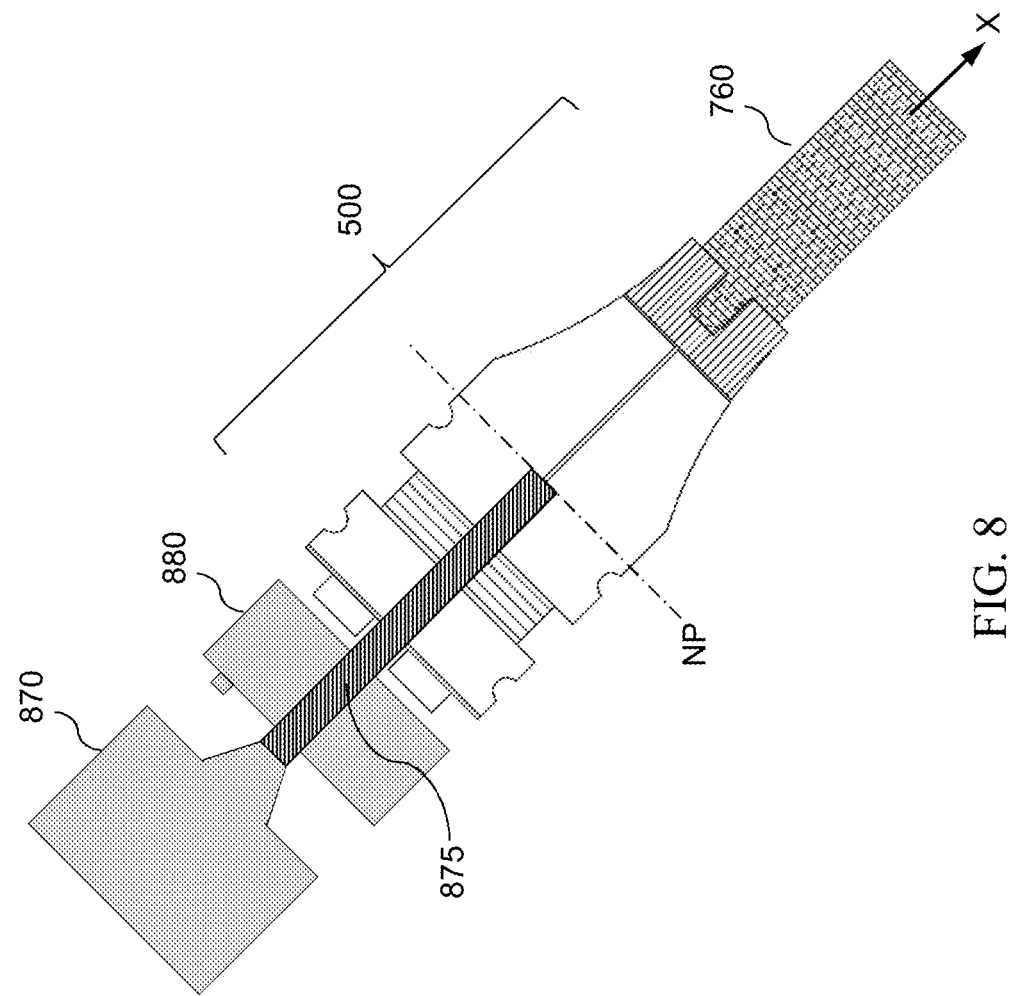
FIG. 8 shows a cross sectional view of a rotary drill according to an embodiment of the present disclosure comprising the percussive drill of FIG. 7 coupled to a rotary actuator.

FIG. 8 shows a cross sectional view of a rotary percussive drill (800) according to an embodiment of the present disclosure comprising the percussive drill (700) of FIG. 7 coupled to a rotary actuator (870). As shown in FIG. 8, a rotary shaft (875) that is actuated by the rotary actuator (870) is rigidly coupled to the nodal plane, NP, of the actuator (500) through a bore inside of the horn (e.g., 210, FIG. 5B) and a though-hole inside of the backing structure (e.g., 230, FIG. 5B). Accordingly, the rotary percussive drill (800) can provide increased output force (higher amplitude ultrasonic displacement in the axial direction X) at the tip of the drill bit (760), combined with rotary action. Furthermore, as shown in FIG. 8, a slip ring (880) arranged between the rotary actuator (870) and the actuator (500) may be used to provide/pass through electrical power from a side of the rotary actuator (870) to the actuator (500). A person skilled in the art may know of other methods/devices to provide electrical power to the actuator (500).

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. An ultrasonic actuator, comprising:
a backing structure;
a plurality of piezoelectric stacks configured to generate ultrasonic frequency vibrations;
a horn configured to amplify the ultrasonic frequency vibrations along an axial direction of the horn; and
a plurality of bolts, each bolt of the plurality of bolts configured to compress a respective piezoelectric stack of the plurality of piezoelectric stacks between the horn and the backing structure,
wherein a radiating surface provided at a surface of the horn that is in contact with the plurality of piezoelectric stacks has a symmetrical shape about the axial direction, and
wherein the symmetrical shape is a shape of a circle having a diameter that is equal to, or larger, than one fourth of a wavelength of operation of the actuator.

2. The ultrasonic actuator according to claim 1, wherein each of the plurality of piezoelectric stacks comprises a central opening through which the respective bolt is arranged.

3. The ultrasonic actuator according to claim 2, wherein each of the plurality of piezoelectric stacks comprises a plurality of piezoelectric elements arranged as a stack, and
each of the plurality of piezoelectric elements comprises a shape of a ring having a central opening for passage of the respective bolt.

4. The ultrasonic actuator according to claim 1, wherein the symmetrical shape is a shape of a circle having a diameter that is in a range between one fourth and one half of a wavelength of operation of the actuator.

5. The ultrasonic actuator according to claim 1, wherein the symmetrical shape is a shape of a circle having a diameter that is in a range between 10.0 and 13.0 centimeters.

6. The ultrasonic actuator according to claim 1, wherein one of the backing structure and the horn comprises a tuning groove that is configured to enhance amplitude uniformity of displacements generated by the ultrasonic frequency vibrations through the one of the backing structure and the horn.

7. The ultrasonic actuator according to claim 6, wherein the tuning groove is formed laterally around a perimeter surface of the backing structure.

8. The ultrasonic actuator according to claim 7, wherein a maximum height of the tuning groove in the axial direction is about one third a height of the backing structure in the axial direction.

9. The ultrasonic actuator according to claim 7, wherein the tuning groove is centrally arranged about the backing structure.

10. The ultrasonic actuator according to claim 6, wherein the other of the backing structure and the horn comprises a tuning groove that is configured to enhance amplitude uniformity of displacements generated by the ultrasonic frequency vibrations through the other one of the backing structure and the horn.

11. The ultrasonic actuator according to claim 1, wherein one of the backing structure and the horn comprises a plurality of tuning slots configured to enhance amplitude uniformity of displacements generated by the ultrasonic frequency vibrations through the one of the backing structure and the horn.

12. The ultrasonic actuator according to claim 11, wherein the plurality of tuning slots separate surface areas of the one of the backing structure and the horn that are in contact with different piezoelectric stacks of the plurality of piezoelectric stacks.

13. The ultrasonic actuator according to claim 11, wherein each of the plurality of tuning slots passes through a surface of the one of the backing structure and the horn that is in contact with the piezoelectric stacks, extends axially toward a respective opposite surface, and stops before said respective opposite surface.

14. The ultrasonic actuator according to claim 12, wherein each of the plurality of tuning slots extends radially from a central region of the one of the backing structure and the horn to a respective perimeter edge of said one of the backing structure and the horn.

15. The ultrasonic actuator according to claim 11, wherein the other of the backing structure and the horn comprises a plurality of tuning slots configured to enhance amplitude uniformity of displacements generated by the ultrasonic frequency vibrations through the other one of the backing structure and the horn.

16. A percussive drill comprising:
the ultrasonic actuator according to claim 1; and
a drill bit rigidly coupled to a tip of the horn of the ultrasonic actuator.

17. A rotary percussive drill comprising:
the ultrasonic actuator according to claim 1;
a drill bit rigidly coupled to a tip of the horn of the ultrasonic actuator; and
a rotary actuator configured to rotate a shaft,
wherein the shaft is rigidly coupled to a nodal plane of the ultrasonic actuator.

18. An ultrasonic actuator, comprising:
a backing structure;
a plurality of piezoelectric stacks configured to generate ultrasonic frequency vibrations;
a horn configured to amplify the ultrasonic frequency vibrations along an axial direction of the horn; and
a plurality of bolts, each bolt of the plurality of bolts configured to compress a respective piezoelectric stack of the plurality of piezoelectric stacks between the horn and the backing structure,
wherein one of the backing structure and the horn comprises a tuning groove that is configured to enhance amplitude uniformity of displacements generated by the ultrasonic frequency vibrations through the one of the backing structure and the horn, and
wherein the tuning groove is formed laterally around a perimeter surface of the backing structure.

19. An ultrasonic actuator, comprising:
a backing structure;
a plurality of piezoelectric stacks configured to generate ultrasonic frequency vibrations;
a horn configured to amplify the ultrasonic frequency vibrations along an axial direction of the horn; and
a plurality of bolts, each bolt of the plurality of bolts configured to compress a respective piezoelectric stack of the plurality of piezoelectric stacks between the horn and the backing structure,
wherein one of the backing structure and the horn comprises a tuning groove that is configured to enhance amplitude uniformity of displacements generated by the ultrasonic frequency vibrations through the one of the backing structure and the horn, and
wherein the other of the backing structure and the horn comprises a tuning groove that is configured to enhance amplitude uniformity of displacements generated by the ultrasonic frequency vibrations through the other one of the backing structure and the horn.

20. An ultrasonic actuator, comprising:
a backing structure;
a plurality of piezoelectric stacks configured to generate ultrasonic frequency vibrations;
a horn configured to amplify the ultrasonic frequency vibrations along an axial direction of the horn; and
a plurality of bolts, each bolt of the plurality of bolts configured to compress a respective piezoelectric stack of the plurality of piezoelectric stacks between the horn and the backing structure,
wherein one of the backing structure and the horn comprises a plurality of tuning slots configured to enhance amplitude uniformity of displacements generated by the ultrasonic frequency vibrations through the one of the backing structure and the horn, and
wherein each of the plurality of tuning slots passes through a surface of the one of the backing structure and the horn that is in contact with the piezoelectric stacks, extends axially toward a respective opposite surface, and stops before said respective opposite surface.

21. An ultrasonic actuator, comprising:
a backing structure;
a plurality of piezoelectric stacks configured to generate ultrasonic frequency vibrations;
a horn configured to amplify the ultrasonic frequency vibrations along an axial direction of the horn; and
a plurality of bolts, each bolt of the plurality of bolts configured to compress a respective piezoelectric stack of the plurality of piezoelectric stacks between the horn and the backing structure,
wherein one of the backing structure and the horn comprises a plurality of tuning slots configured to enhance amplitude uniformity of displacements generated by the ultrasonic frequency vibrations through the one of the backing structure and the horn, and
wherein the other of the backing structure and the horn comprises a plurality of tuning slots configured to enhance amplitude uniformity of displacements generated by the ultrasonic frequency vibrations through the other one of the backing structure and the horn.

* * * * *